United States Patent [19]

Bochkarev et al.

[11] 4,063,529
[45] Dec. 20, 1977

[54] DEVICE FOR EPITAXIAL GROWING OF SEMICONDUCTOR PERIODIC STRUCTURES FROM GAS PHASE

[76] Inventors: Ellin Petrovich Bochkarev, Khlebozavodskoi proezd, 3, kv. 16; Vadim Nikolaevich Maslov, ulitsa Al. Tolstogo, 22/2, kv. 101; Nikolai Georgievich Voronin, Petrozavodskaya ulitsa, 15, korpus, 2, kv. 164; Oleg Evgenievich Korobov, Golikovsky pereulok, 13, kv. 6; Eduard Ivanovich Gavrilin, Michurinsky prospekt, 18, korpus 2, kv. 11, all of Moscow, U.S.S.R.

[21] Appl. No.: 788,969

[22] Filed: Apr. 19, 1977

[51] Int. Cl.$^2$ ............................................. C23C 13/08
[52] U.S. Cl. ..................................................... 118/49.1
[58] Field of Search ................ 118/48, 49, 49.1, 49.5

[56] References Cited

U.S. PATENT DOCUMENTS

| 3,008,447 | 11/1961 | Lacroix | 118/48 UX |
| 3,047,424 | 7/1962 | Suchoff | 118/49.1 X |
| 3,047,438 | 7/1962 | Marinace | 118/49.5 X |
| 3,131,099 | 4/1964 | Constantakes | 118/48 UX |
| 3,425,878 | 2/1969 | Dersin et al. | 118/49.1 X |

*Primary Examiner*—Wm. Carter Reynolds
*Attorney, Agent, or Firm*—Haseltine, Lake & Waters

[57] ABSTRACT

A device for epitaxial growing of semiconductor periodic structures from a gas phase, comprises a pressure-tight tubular reactor filled with gas and set in a tilted position, an electric motor located outside the reactor and designed to rotate said reactor about its longitudinal axis, at least one group of elements located inside the reactor, comprising a holder of at least two sources of substances of different solid semiconductor materials, which are adjacent to each other, a unit for holding at least one substrate and a device for maintaining a constant clearance between the surfaces of the substrate and the sources, as well as heaters of the sources and the substrate located outside the reactor.

3 Claims, 3 Drawing Figures

DEVICE FOR EPITAXIAL GROWING OF SEMICONDUCTOR PERIODIC STRUCTURES FROM GAS PHASE

The present invention relates to production of semiconductor materials and structures and, in particular, relates to a device for epitaxial growing of semiconductor periodic structures from a gas phase.

Known in the art are devices whose principle of operation is based upon epitaxial growing of semiconductor periodic structures from a gas phase by means of quick periodic changing of the concentration of the variable component in the gas flow supplied from the substance sources to the substrate.

The known device for epitaxial growing of semiconductor periodic structures from a gas phase is provided with a vertical tubular reactor filled with a gas containing an agent for carrying a chemical transport reaction. The tubular reactor volume is about 100 cm$^3$ and it houses a substrate. Source heaters and substrates are located outside the reactor and produce the required temperature difference therebetween, which makes the chemical transport reaction possible.

Sources of substances making up the layers of the semiconductor periodic structure being grown are located both inside the tubular reactor and outside. The sources producing readily volatile components are placed outside the tubular reactor, whereas the source of a low-volatile component is positioned inside the tubular reactor.

The mechanism which ensures a specific sequence of supplying substances from the sources to the substrate is made as an injection system located outside the tubular reactor, which is provided with a triple solenoid valve and an electronic time switch flipping said valve.

The injection system of this known device is designed for quick dosing of the gas phase components whose ratio is determined by the position of the triple solenoid valve controlling the supply of substances from the sources located outside the tubular reactor.

The electronic time switch sets the frequency of flipping of this solenoid valve and controls the duration of the injection cycles when each gas mixture is supplied to the tubular reactor and their compositions correspond to the compositions of alternating layers in the periodic semiconductor structure being grown.

The above described device is used for epitaxial growing of a "superlattice" periodic semiconductor structure based on GaAs$_{1-x}$P$_x$ solid solution, where $x$ varies (where $x$ is the molar fraction of the GaP components in the GaAs$_{1-x}$P$_x$ solid solution. In this case the sources of arsenic and phosphorus are bottles containing phosphine PH$_3$ and arsine AsH$_3$ mixed with hydrogen, which are placed outside the reactor, whereas the source of gallium is metallic gallium placed in a vessel located in the upper part of the tubular reactor. The reactor is permanently fed with a mixture of gases H$_2$ and HCl, the latter being the agent for carrying the chemical transport reaction. The flow of arsine which is also supplied into the tubular reactor is constant, whereas the flow of phosphine is periodically cut off by means of the triple solenoid valve.

The above described device was used to grow periodic semiconductor structures with a period within the range of from 225 to 1,000 A and the amplitude $\Delta x$ of periodic variation of the phosphorus content from 0.1 to 0.4 atom fractions.

With the injection cycle length of 2 seconds and the epitaxial growth speed of 40 microns/hr a periodic semiconductor structure was grown whose layers were 110 A thick and deviations of the thickness from its average value throughout the grown periodic structure did not exceed 1 percent.

The above described device can be used to produce semiconductor periodic structures based upon solid solutions of different nature, though gaseous source substances are to be employed in any case.

The known device permits the process of growing a periodic structure only in a flow of gas, because the mechanism located outside the reactor, which ensures a specific sequence of supplying substances from the sources to the substrate, cannot provide periodic dosing of substances at a pressure significantly differing from the atmospheric pressure, that is in vacuum or at a pressure within the reactor amounting to 5-10 atmospheres.

These limited capabilities of the known design result in that sublimation in vacuum and chemical transport at a low pressure (0.1 atm and lower) or at a high pressure (5-10 atm) cannot be used for production of periodic structures. This restricts the scope of substances and chemical reactions employed for production of some vital semiconductor periodic structures.

The known device uses as sources gaseous volatile substances and compounds which should be synthesized in advance and be highly purified, chemically stable for storage and during operation, when passing through the triple valve and connecting pipes, as well as be chemically neutral with respect to the material of the tubular reactor.

Thus, the known device cannot be used to obtain a periodic structure based on the Ga$_x$Al$_{1-x}$As, because aluminum chloride required for production of such a structure reacts actively with quartz of the tubular reactor at operating temperatures necessary for epitaxial growing.

The known device is characterized by great losses of source substances, caused by the gas flow atmosphere in the tubular reactor. Thus, when the structure is being grown, the gas mixture flow carries about 95% of the source substances out of the reactor and only 5% at best are precipitated onto the substrate as epitaxial layers of the structure being produced.

Low efficiency of the known device can be attributed to the small size of the tubular reactor which can accommodate only one 15 mm substrate to produce a superlattice structure with a period of about 200 A.

The gas phase should be changed about every one second for epitaxial growing of semiconductor structures of such a type, which can be ensured only with a small capacity of the tubular reactor, solenoid valve and connecting pipes.

That is why any increase of the output achieved by enlarging the volume of the tubular reactor is accompanied by deterioration of accuracy of dosing of source substances and, consequently, worse quality of the structure being grown.

Besides, it becomes impossible to obtain superlattice structures with a small period and a distinct boundary between layers.

The present invention is, therefore, concerned with a device for epitaxial growing of semiconductor periodic structures from a gas phase, whose design permits wider scope of source substances and chemical reactions required for obtaining some important structures.

Another object of the invention is to provide a device which permits elimination of gaseous substances as sources and localize the process of transfer of substances from the sources and the substrate within a specified portion of the inner space of the tubular reactor, thus making it less possible for the volatile substances to contact the walls of the latter.

Yet another object of the invention is to provide a device for epitaxial growing of semiconductor periodic structures from a gas phase, which possesses high efficiency (in particular for production of superlattice structures).

Still another object of the invention is to provide a device ensuring minimum losses of source semiconductor substances for epitaxy.

And, finally, it is an object of this invention to provide a device which permits growing of structures characterized by high purity and quality of alternating layers.

These and other objects are achieved by that a device for epitaxial growing of semiconductor periodic structures from a gas phase, comprising a tubular reactor and a substrate placed therein, filled with gas containing an agent required for the chemical transport reaction, at least two sources of substances making up the layers of the semiconductor periodic structure being grown, as well as heaters of the sources and the substrate, located outside the reactor and close to the latter and producing the temperature difference between the sources and the substrate, required for carrying the chemical transport reaction, according to the invention, is provided with an electric motor located outside the reactor and intended for rotation of said reactor about its longitudinal axis and kinematically connected to the latter and at least one group of elements located inside the reactor, comprising one holder for at least two sources of substances made of different solid semiconductor materials, placed in one plane adjacent to each other, one unit for holding at least one substrate and a device for keeping a constant clearance between the surfaces of the substrate and the sources, the reactor in this case is made pressure-tight and tilted at an angle between its longitudinal axis and the horizontal plane being selected from an interval of from 10° to 80°, each holder being rigidly secured inside the reactor in a position ensuring that the surfaces of the sources are perpendicular to the longitudinal axis of the reactor, each respective unit for holding the substrate being located above the holder free with respect to the reactor at a distance from the holder, which ensures a specific clearance between the surfaces of the substrate and the sources, selected from an interval of from 50 microns to 1 mm and maintained by the device for keeping a constant clearance between said surfaces.

It is advisable that each unit for holding a substrate be made as an asymmetrical body provided with a flat surface for securing the substrate, whereas the device for keeping a constant clearance is made as a rod whose one end is rigidly connected to the asymmetrical body and set with respect to its flat surface perpendicular thereto and whose other end is placed in the center of the holder perpendicular to the surface of the sources so that the rod and the holder are able to rotate with respect to each other, when the reactor rotates about its longitudinal axis.

It is also advantageous that each unit for holding a substrate be made as a cylindrical body having a flat base to attach a substrate whose diameter is selected from a range of from 1 to 1.5 radii of the cross-section of the tubular reactor, whereas the device for keeping a constant clearance be made as a frame of a uniform thickness, which is secured with respect to the surface of the sources along the boundary where the holder contacts the inner surface of the reactor.

Other objects and advantages of the present invention will become apparent from the following detailed description of embodiments thereof, taken in conjunction with the drawings, in which.

Figure 1:
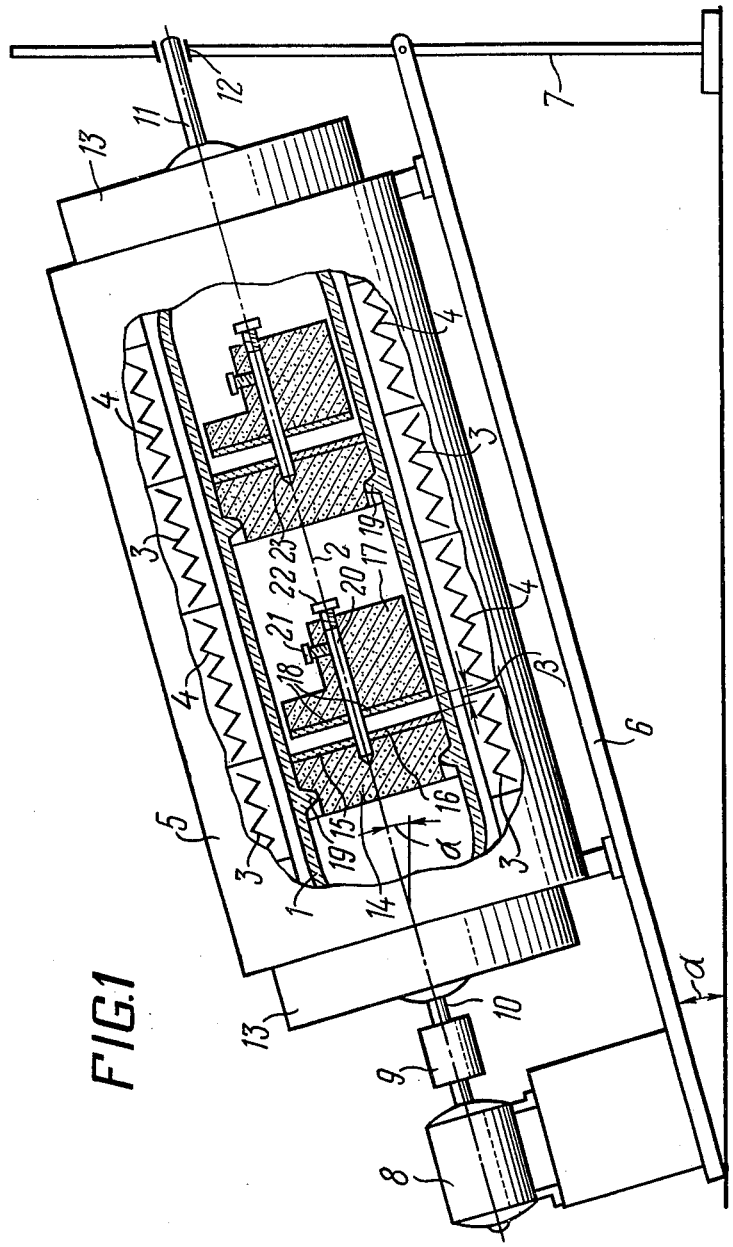
FIG. 1 shows a longitudinal section view of a tubular reactor of a device for epitaxial growing of semiconductor periodic structures from a gas phase, according to the invention.

Let us deal in more detail with an embodiment of the device for epitaxial growing of semiconductor periodic structures from a gas phase, shown in FIG. 1.

Here a tubular reactor 1 is a pressure-tight quartz ampoule filled with gas containing an agent for the chemical transport reaction.

The required gas composition inside the reactor 1 and, consequently, the state of the gas medium, be it high pressure, atmospheric pressure or low pressure, are provided in advance depending on what semiconductor periodic structure is to be obtained, what sources of substances and types of chemical transport reactions are to be used.

The tubular reactor 1 is set tilted at an angle α of a longitudinal axis 2 to the horizontal plane, which is selected from an interval from 10° to 80°.

Around and outside the reactor 1 are positioned heaters 3 of sources and heaters 4 of a substrate protected from the environment by a shell 5 mounted upon a bearing plate 6 secured by the upturned end thereof to a vertical post 7 as shown in FIG. 1.

The same bearing plate 6 carried an electric motor 8 for rotating the reactor 1, which is kinematically connected via a coupling 9 and a shaft 10 to the lower butt end of the reactor 1.

The upper butt end of the reactor 1 is mechanically connected to a shaft 11 located, like the shaft 10, along the axis 2 of the reactor 1.

The extending end of the shaft 11 is mounted in a bearing 12 of the vertical post 7.

Units 13 of reflective heaters are placed both near the upper and lower butt ends of the reactor 1. Such heaters eliminate condensation of the chemical agent for the chemical transport reaction and of the reaction products upon the quartz walls of the reactor 1.

At least one group of elements is located inside the reactor 1. Each group comprises closely arranged one holder 14 for at least two sources 15 and 16 of substances making up the layers of the periodic semiconductor structure being grown, one unit 17 for holding at least one substrate 18 and a device for keeping constant the clearance between the surfaces of the substance sources 15 and 16 and the substrate 18.

The drawing shows two such groups, the elements of each group carry two sources 15 and 16 and one substrate 18, though their number is not limited and can be any, selected in accordance with the demands to the output capacity of the device.

The sources 15 and 16 of substances making up the layers of the semiconductor periodic structure being grown are plates made of different solid semiconductor materials. These plates are set in the holder 14 of the sources 15 and 16 adjacent to each other.

Each holder 14 of the sources 15 and 16 is secured within the tubular reactor 1 by means of protrusions 19 and arranged so that the surfaces of the sources 15 and 16 are perpendicular to the logitudinal axis 2 of the reactor 1.

Each respective unit 17 for holding the substrate 18 is located inside the reactor 1 above the respective holder 14 and arranged at random with respect to the reactor 1. The unit 17 for holding the substrate 18 is located at a distance from the holder 14 of the sources 15 and 16, which depends on the specified clearance $\beta$ between the surface of the closely arranged substrate 18 and the sources 15 and 16.

This clearance $\beta$ is usually selected from the interval from 50 microns to 1 mm, when arranging the unit 17 and the holder 14. In this case the selection is based on the conditions of the chemical transport reaction ensuring alternate transfer of substances from the sources 15 and 16 to the substrate 18.

The clearance $\beta$ is set by means of a device for keeping a constant clearance, which can be made as a rod 20 secured to the unit 17 by screws 21 and 22.

The unit 17 for holding the substrate 18 is made as an asymmetrical body of graphite, provided with a flat surface for the substrate 18. The quartz rod 20 is placed in the central through hole of said unit 17 and rigidly secured in this hole by means of the adjustment screw 22 and the lock screw 21 perpendicular to the flat surface of the unit 17.

The extending end of the rod 20 is mounted in a depression 23 made in the center of the graphite holder 14 of the sources 15 and 16.

In this case the rod 20 can be secured in the through hole of the unit 17 by means of only one screw 22.

Figure 2:
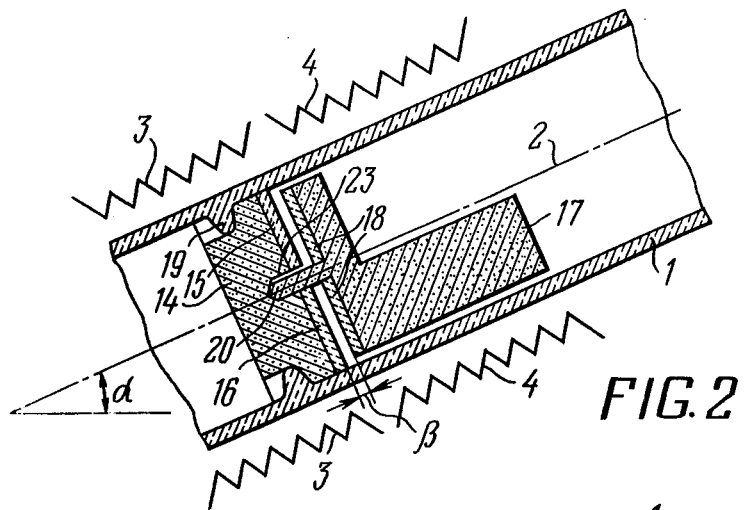
FIG. 2 shows a longitudinal section view of a part of a tubular reactor of a device featuring one of the embodiments of a unit for holding a substrate and a rod, according to the invention.

Besides, the rod 20 and the unit 17 in another embodiment are made as one solid part as shown in FIG. 2.

Figure 3:
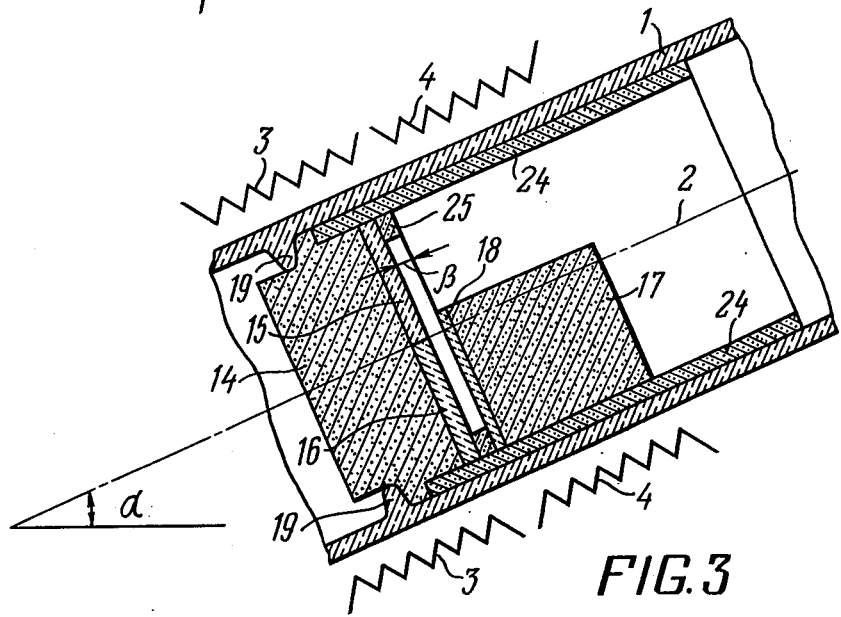
FIG. 3 shows a longitudinal section view of a part of a tubular reactor of a device featuring another embodiment of a unit for holding a substrate, made as a cylindrical body, according to the invention.

The unit 17 for holding the substrate 18 can be made as a regular cylindrical body of graphite as shown in FIG. 3. The substrate 18 is secured upon the flat base of the cylindrical body and the diameter of this base amounts to 1 or 1.5 radii of the cross section of the tubular reactor 1.

A hollow graphite cylinder 24 is intimately mated with the inner surface of the tubular reactor 1 so as to ensure a specific coefficient of friction between the unit 17 and the inner surface of the reactor 1.

The device for keeping a constant clearance is made as a graphite frame 25 of a uniform thickness, which is secured on the side of the surfaces of the sources 15 and 16 along the boundary where the graphite holder 14 of the sources 15 and 16 contact the inner surface of the tubular reactor 1.

The angle $\alpha$ is selected with due regard to providing conditions for relative rotation of the unit 17 and the holder 14 and maintaining the clearance $\beta$ constant.

Let us discuss the operation of the device for epitaxial growing of a semiconductor periodic structure from a gas phase according to the invention exemplified by production of a periodic waveguide structure based on the GaAs-GaP system.

In this case the chemical transport reaction with iodine, the GaAs plate with the orientation (III) being used as the substrate 18 (FIG. 1).

In this embodiment the source 15 is a semicircular GaAs plate and the source 16 is a semicircular GaAs$_{0.9}$P$_{0.1}$ plate. The holder 14 and the unit 17 are arranged with respect to each other so that the clearance $\beta$ between the surface of the substrate 18 and the surfaces of the sources 15 and 16 parallel thereto is equal to 200 microns. The tubular reactor 1 containing an ampoule with a weighed amount of iodine which is the chemical transport agent is evacuated by the known method to a pressure of $1 \cdot 10^{-5}$ mm Hg, pressurized and set at an angle $\alpha$ equal to 45°.

The holder 14 and the unit 17 are then heated to an average operating temperature 830° C and adjust the power of the heaters 3 and 4 so as to ensure a 20° difference between the temperature of the sources 15 and 16 and the temperature of the substrate 18.

The ampoule containing iodine is thereafter opened by the known method. The amount of iodine provides a weight concentration of iodine within the reactor 1 equal to 10 mg/cm$^3$.

At the average operating temperature of 830° C the pressure within the reactor 1 rises over 4 atmospheres, when the weighed amount of iodine is evaporated, which intensifies the chemical transport reaction and ensures high velocity of the epitaxial growth of the structure layer, reaching 420 microns/ hr.

The process of epitaxial growing of such a periodic structure comprising alternating GaAs and GaAs$_{0.9}$P$_{0.1}$ layers is performed in two stages. At first, a 10 micron thick GaAs buffer layer is grown during 80 seconds, the holder 14 being immobile with respect to the unit 17.

Then, the motor 8 is turned on to rotate the reactor 1 together with the holder 14 of the sources 15 and 16 with respect to the unit 17 and the substrate 18 secured thereon.

In this case, in the embodiment of FIG. 1 the unit 17 made as an asymmetric body remains immobile with respect to the rotating holder 14 of the sources 15 and 16, because the center of gravity of the unit 17 is all the time lower than the longitudinal axis 2 of the reactor 1, which coincides with the rotation axis of the holder 14, whereas the coefficient of friction between graphite of the holder 14 and quartz of the rod 20 is negligible.

When the unit 17 is made as in FIG. 3, the graphite unit 17 swings upon the graphite cylinder 24 on the inner surface of the tubular reactor 1, when the latter rotates, the rotation axis of the unit 17 for holding the substrate 18 is all the time lower than the axis 2 of the reactor 1, which coincides with the rotation axis of the holder 14 of the sources 15 and 16.

In this way, in both cases the sources 15 and 16 alternate with respect to the substrate 18 owing to the rotation of the reactor 1 about the axis 2.

A periodic structure with a period of 2,400 Å, comprising 100 periods and having a total thickness of 24 microns is grown by means of 100 revolutions of the reactor 1 about the axis 2, performed at a speed of 30 revolutions per minute during 200 seconds.

The rotation is stopped thereafter, the reactor 1 is cooled, opened and the substrate 18 is taken out with the semiconductor periodic structure based on the GaAs-GaP system.

When such structure is grown through the use of the iodine vapours pressure which is several times over the atmospheric pressure, a high speed of epitaxial growth is achieved, while retaining a perfect crystalline periodic structure and a smooth surface of the epitaxial layer and, consequently, a five- or six-fold increase in the output capacity of the proposed device as compared to the known one.

Similar devices can be used to grow epitaxially a semiconductor periodic superlattice structure produced on the basis of the GaAs-AlAs system.

When such a structure is produced, the substrate 18 unlike in the previous case is a GaAs plate with an orientation (100), the source 15 is a GaAs plate made as a truncated sector with an angle of 300° and the source 16 is a plate featuring an epitaxially grown $Ga_{0.8}Al_{0.2}As$ layer which is 50 microns thick and precipitated upon a gallium arsenide substrate made as a truncated sector with an angle of 60°.

The clearance $\beta$ is set equal to 100 microns, the reactor 1 is evacuated to a residual pressure of $1\cdot10^{-6}$ mm Hg, pressurized by soldering and set at an angle $\alpha = 30°$.

The sources 15 and 16 are heated to a temperature of 720° C and the substrate 18 to a temperature of 690° C.

In order to ensure the chemical transport reaction the weight concentration of iodine in the volume of the reactor 1 is built up to 1 mg/cm$^3$ and the iodine vapour pressure to 0.4 atm., the speed of epitaxial growing in this case is 3.6 microns/hr.

A periodic semiconductor superlattice structure with a period of 100 A, comprising 60 periods and having a total thickness of 0.6 microns is grown by rotation of the reactor 1 about the axis 2 during 10 minutes, the motor 8 revolving at 6 rev./min.

The rotation is stopped thereafter and make a 10 min interval during which a 0.6 micron thick contact layer of GaAs is grown on the periodic structure. When such superlattice structure is grown on the basis of the GaAs-AlAs system, chemical transfer of aluminiferous products is localized within a small volume of the gas phase between the surfaces of the sources 15 and 16 and the substrate 18. Leakage of these products into the surrounding volume of the reactor 1 is insignificant and practically no interaction of aluminum iodides with the quartz walls of the reactor 1 is observed.

What is claimed is:

1. A device for epitaxial growing of semiconductor periodic structures from a gas phase, comprising:

a pressure-tight reactor tilted at an angle between its longitudinal axis and the horizontal plane, which is selected from an interval of from 10° to 80°, and filled with gas containing an agent for carrying the chemical transport reaction;

an electric motor for rotation of said reactor about its said longitudinal axis, located outside the reactor and kinematically connected to the latter;

at least two sources of substance, which are made of different solid semiconductor materials and located inside said reactor in one plane and adjacent to each other;

at least one substrate located inside said reactor in the vicinity of said substance sources;

at least one group of elements, located inside the reactor and comprising a holder of said at least two substance sources, a unit for holding at least one said substrate and a device for maintaining a constant clearance between the surfaces of said substrate and said sources;

a heater of said substance sources, located outside said reactor in the vicinity of said sources;

a heater of said substrate, located outside said reactor and in the vicinity thereof and producing together with said heater of said sources the required difference in temperature between said sources and said substrate;

said holder of said sources of substances of each of said group of elements, being rigidly secured inside said reactor in a position ensuring perpendicularity of the surfaces of said sources with respect to said longitudinal axis of said reactor;

said unit for holding said substrate of each said group of elements, located above said holder of said sources free with respect to said reactor and at a distance from said holder, which depends upon the required clearance between said surfaces of said substrate and sources;

said device for maintaining a constant clearance between said surfaces, which sets said clearance selected from an interval of from 50 microns to 1 mm.

2. A device as claimed in claim 1, in which each said unit for holding a substrate is made as an asymmetrical body with a flat surface for holding said substrate, whereas said device for maintaining a constant clearance is made as a rod whose one end is rigidly secured to said asymmetrical body from the side of its flat surface and perpendicular thereto and whose other end is placed in the center of said holder perpendicular to said surface of said sources so that said rod and said holder are able to rotate with respect to each other when said reactor rotates about the longitudinal axis of the latter.

3. A device as claimed in claim 1, in which each said unit for holding a substrate is made as a cylindrical body having a flat base for holding said substrate, whose diameter is selected from a range of from 1 to 1.5 radii of the cross-section of said reactor, whereas said device for maintaining a constant clearance is made as a frame of a uniform thickness, secured from the side of said surface of said sources along the boundary where said holder contacts the inner surface of said reactor.

* * * * *